US006608312B1

(12) United States Patent
Okada et al.

(10) Patent No.: US 6,608,312 B1
(45) Date of Patent: Aug. 19, 2003

(54) INFORMATION READING APPARATUS, METHOD OF PRODUCING SAME, AND RADIATION IMAGING SYSTEM HAVING SAME

(75) Inventors: Satoshi Okada, Zama (JP); Masakazu Morishita, Hiratsuka (JP); Chiori Mochizuki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 09/653,010

(22) Filed: Aug. 31, 2000

(30) Foreign Application Priority Data

Sep. 3, 1999 (JP) .......................................... 11-250295

(51) Int. Cl.⁷ ................................................ G01T 1/20
(52) U.S. Cl. ................................ 250/370.11; 250/487.1
(58) Field of Search ........................ 250/370.11, 487.1

(56) References Cited

U.S. PATENT DOCUMENTS

| | | | | |
|---|---|---|---|---|
| 5,276,329 A | * | 1/1994 | Hughes | 250/370.11 |
| 5,786,597 A | * | 7/1998 | Lingren et al. | 250/370.09 |
| 5,844,243 A | * | 12/1998 | Lee et al. | 250/370.09 |
| 6,075,256 A | | 6/2000 | Kaifu et al. | 257/53 |
| 2001/0023924 A1 | | 9/2001 | Takabayashi et al. | 250/361 R |

FOREIGN PATENT DOCUMENTS

JP          1-128578          5/1989

* cited by examiner

Primary Examiner—Constantine Hannaher
Assistant Examiner—Shun Lee
(74) Attorney, Agent, or Firm—Fitzpatrick, Cella, Harper & Scinto

(57) ABSTRACT

In order to prevent a scintillator of an information reading apparatus from being broken in a bonding step, a protective layer is formed so as to cover the scintillator so that the shape of the scintillator is not broken.

16 Claims, 15 Drawing Sheets

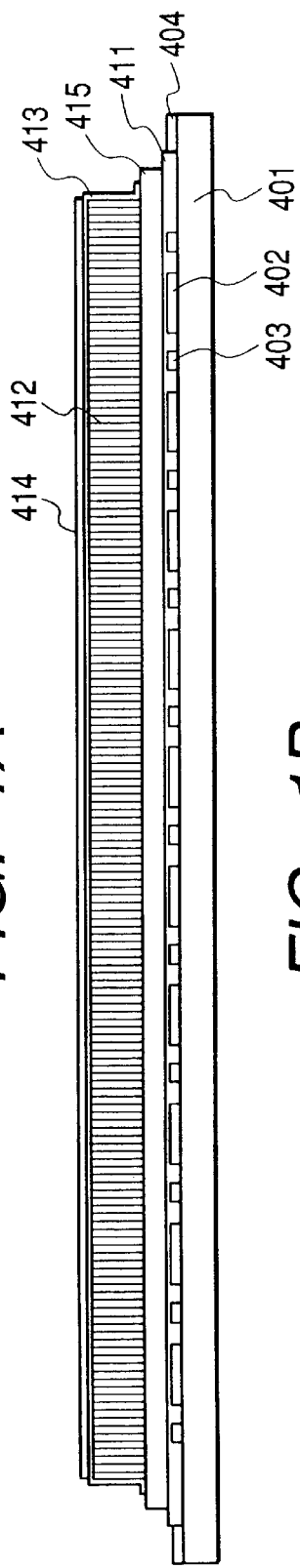
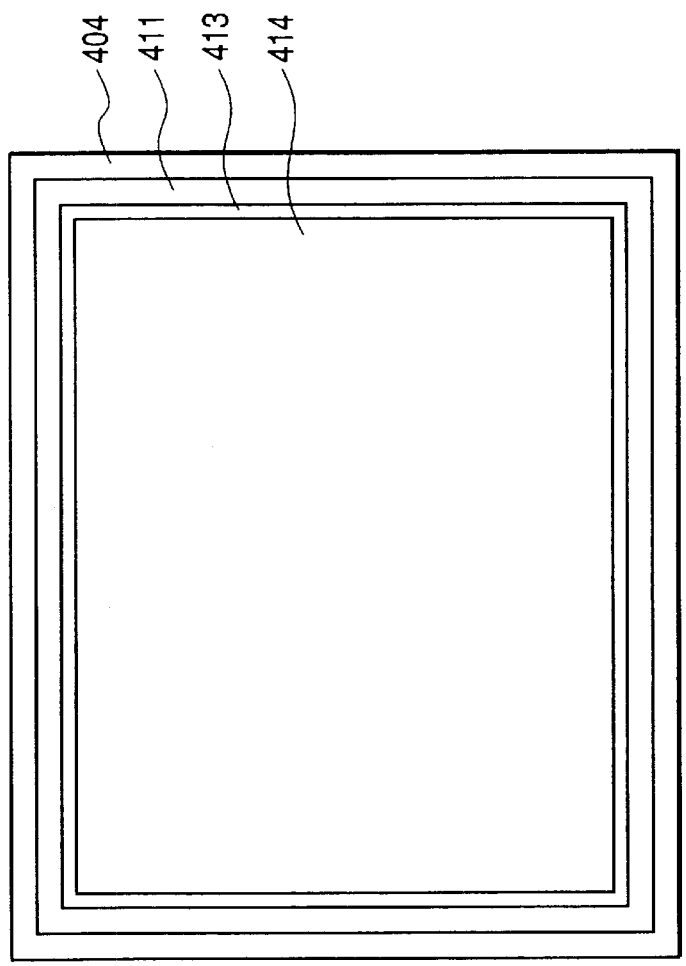
FIG. 1A
FIG. 1B

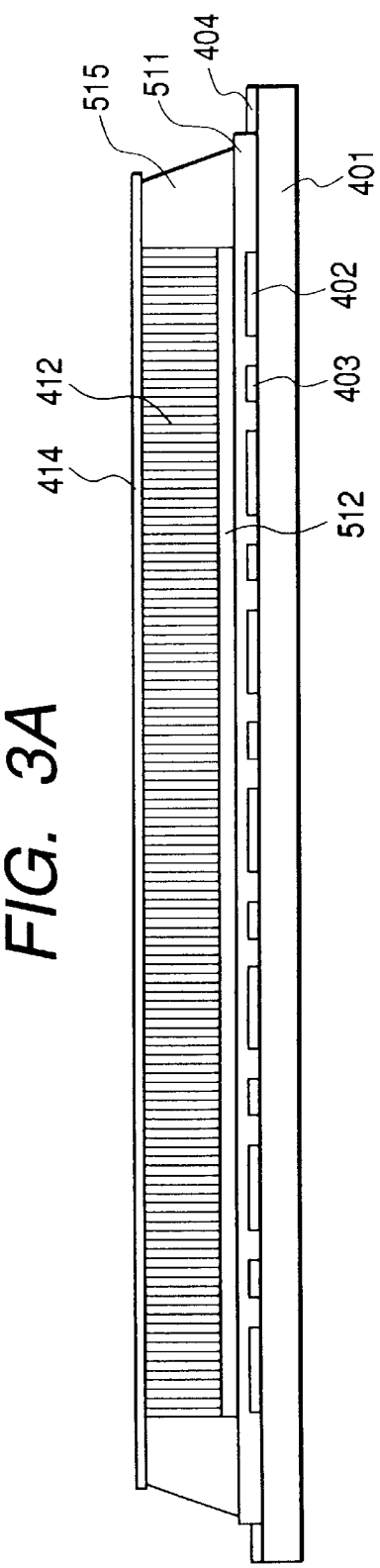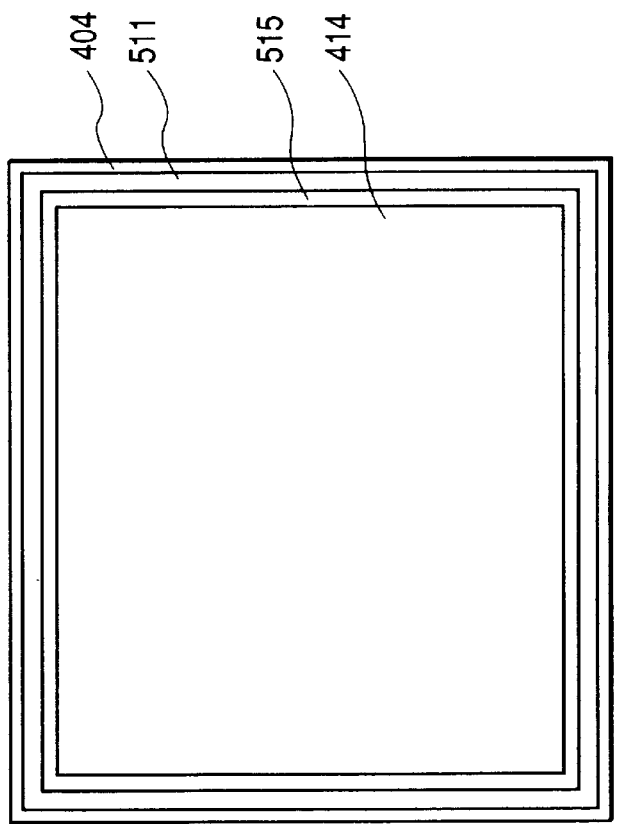
FIG. 3A
FIG. 3B

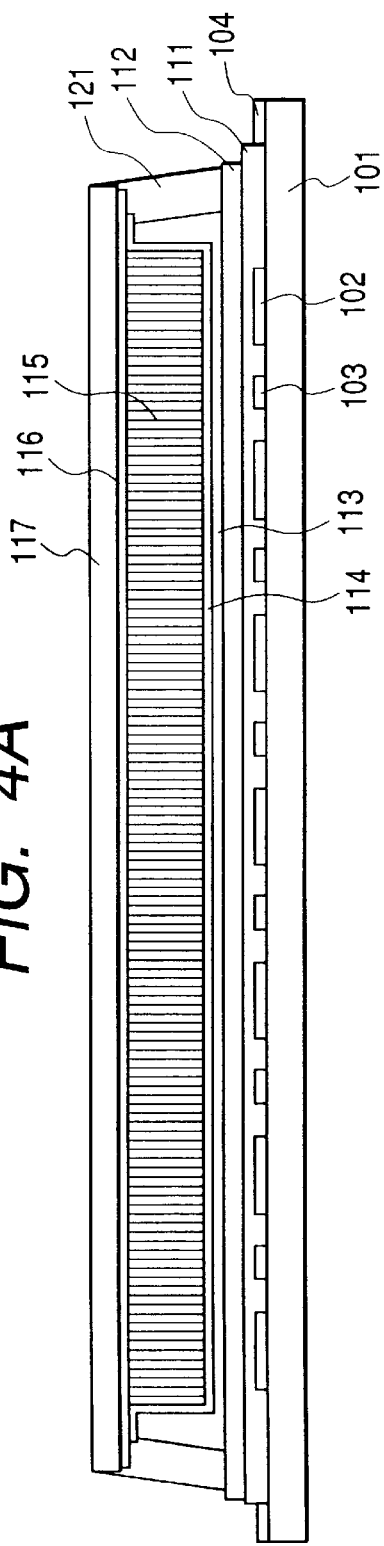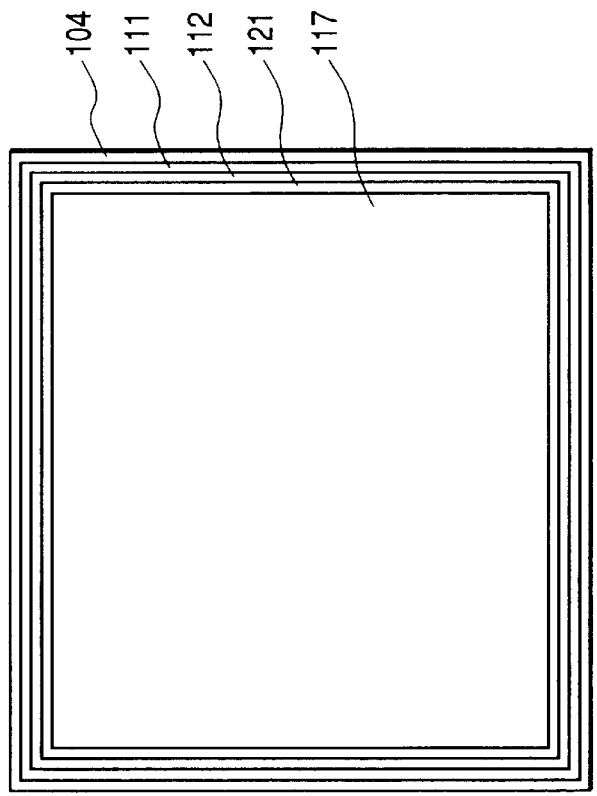

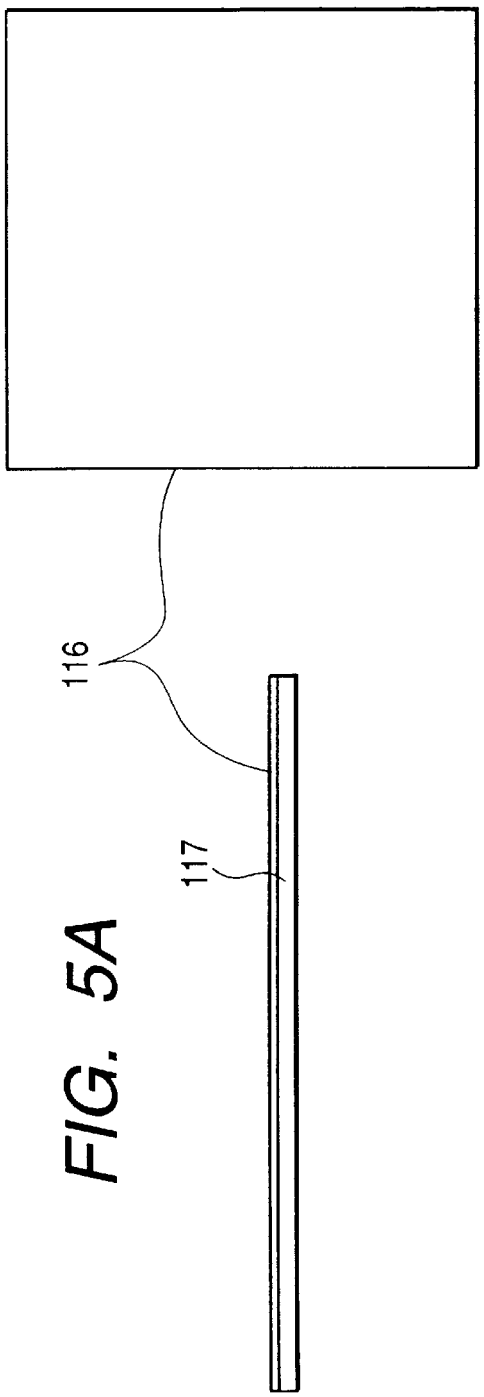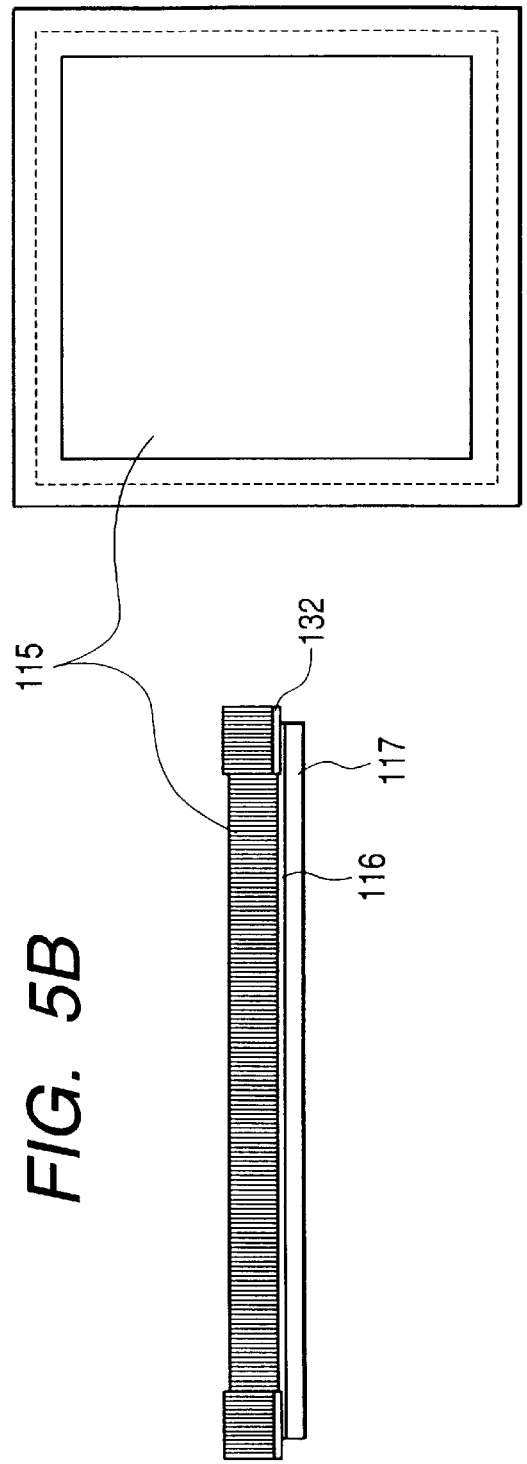

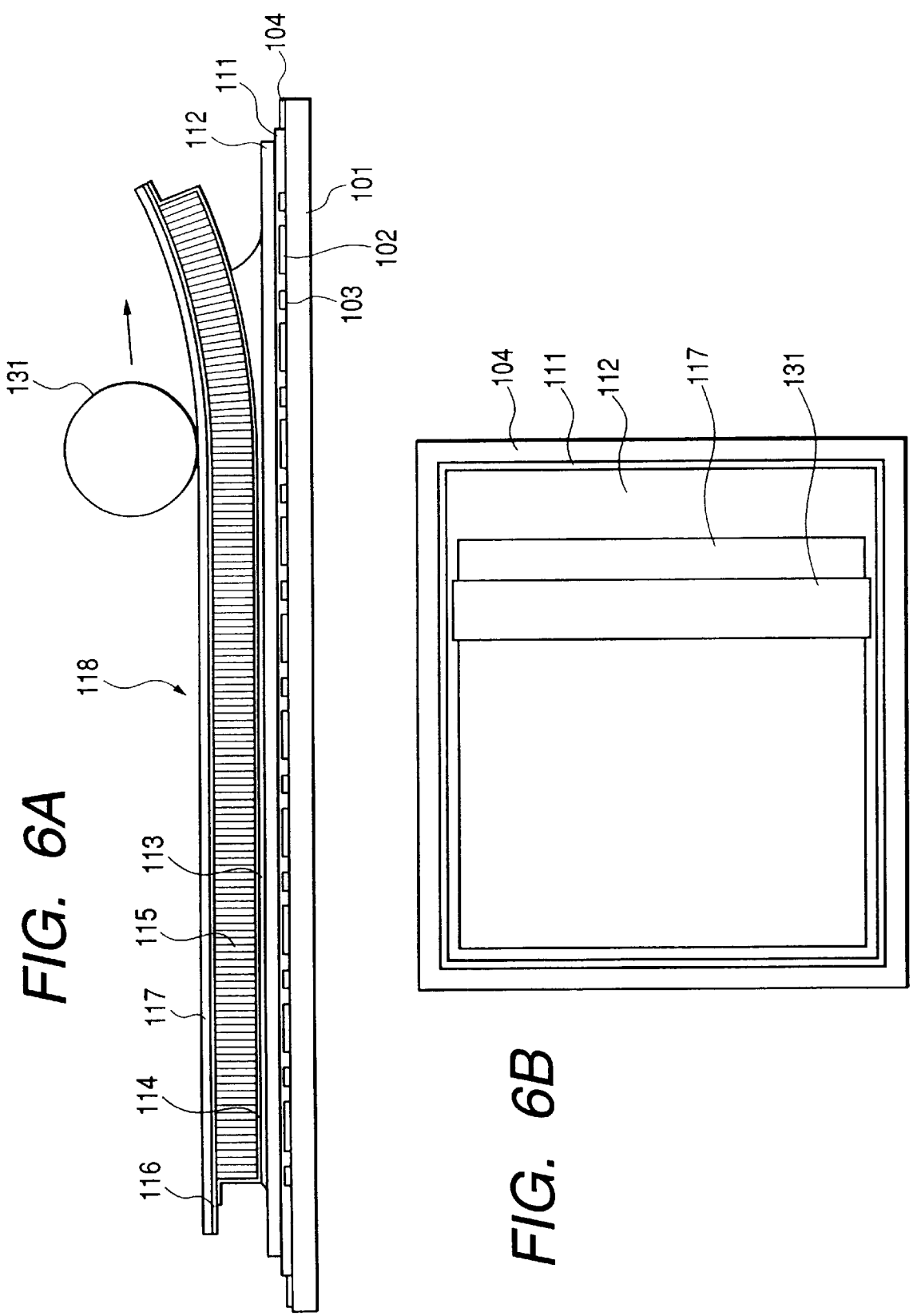

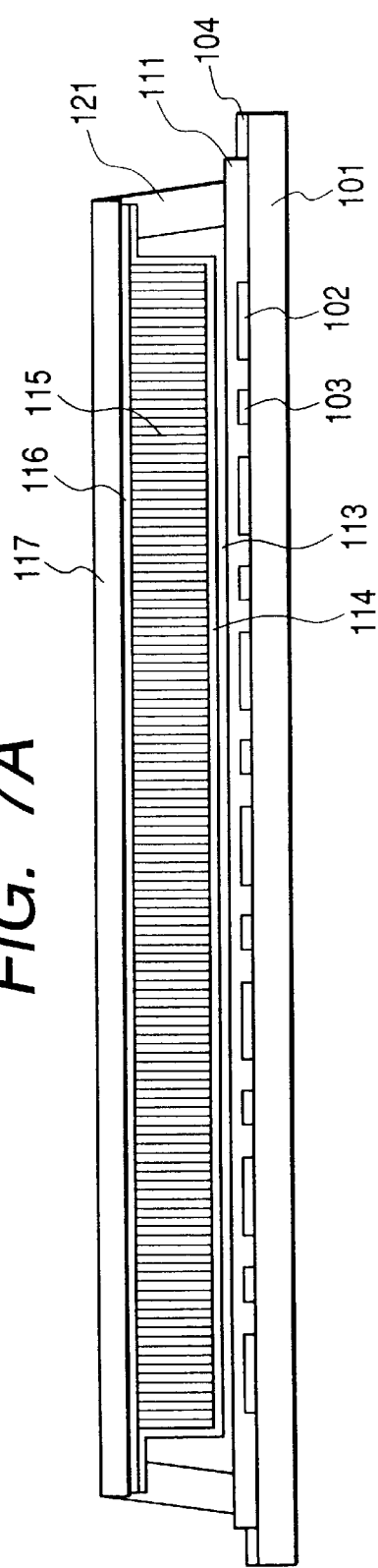
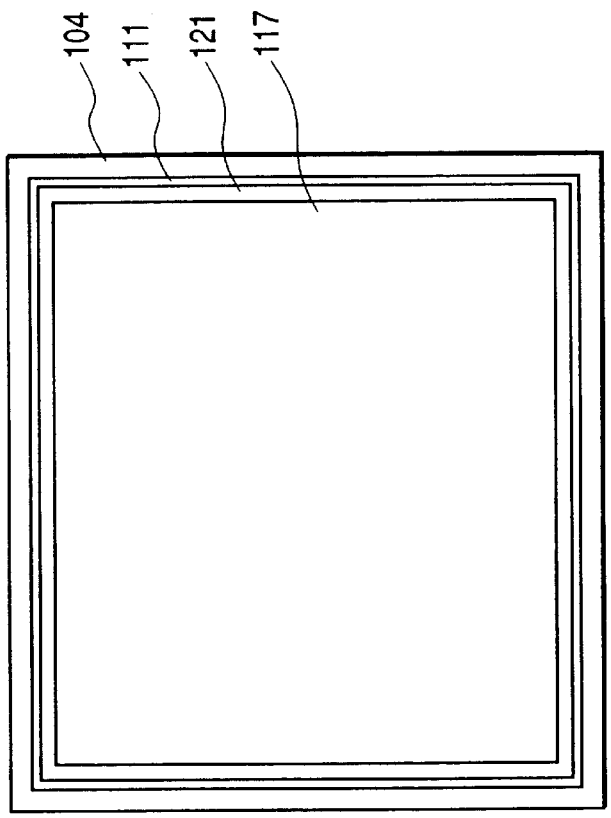

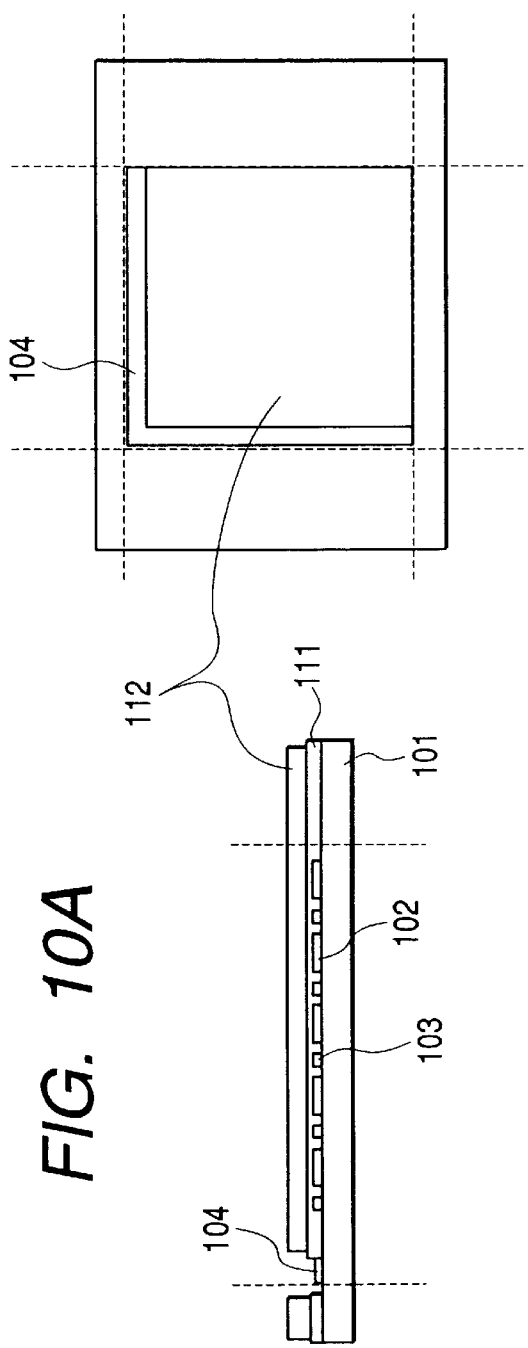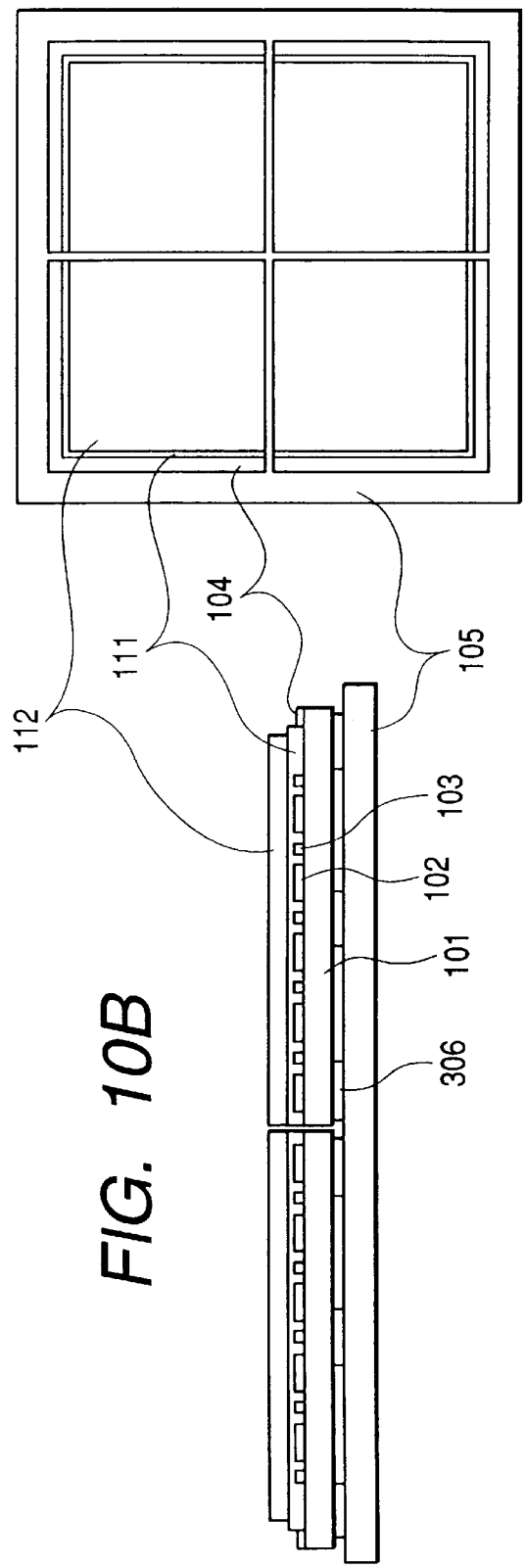
FIG. 10A
FIG. 10B

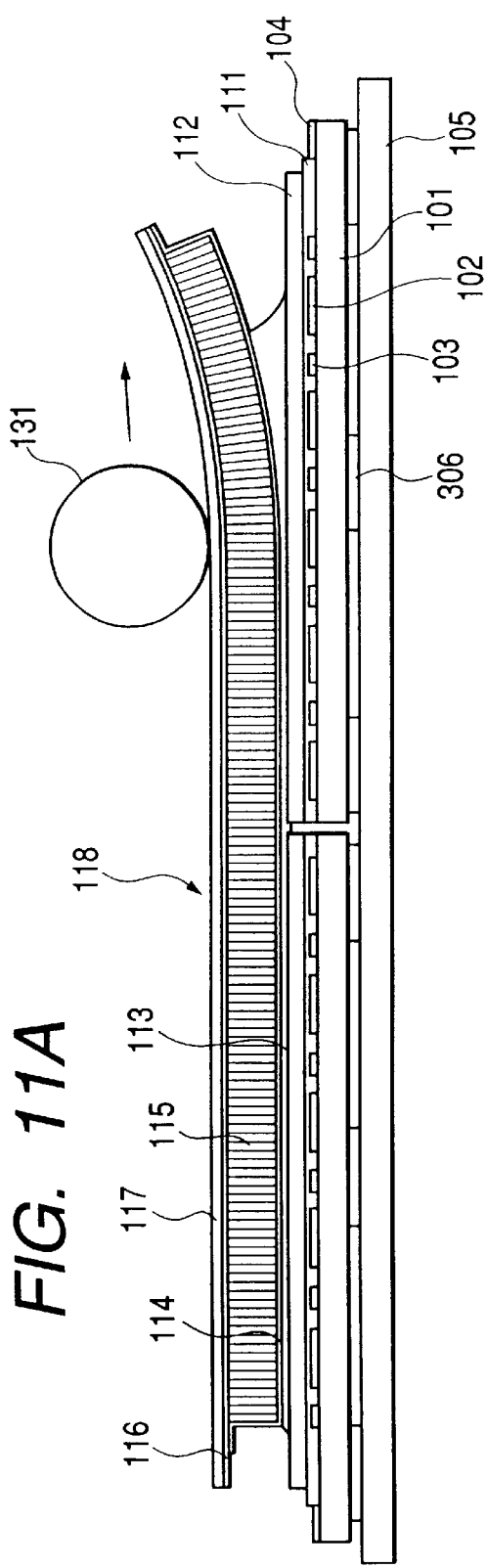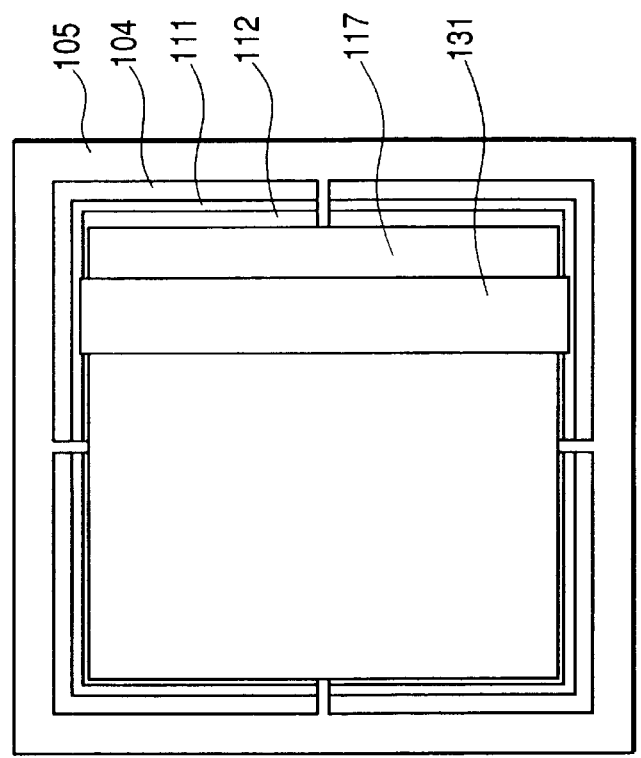

INFORMATION READING APPARATUS, METHOD OF PRODUCING SAME, AND RADIATION IMAGING SYSTEM HAVING SAME

BACKGROUND OF THE INVENTION

1. Field of the Invention

The present invention relates to an information reading apparatus, a method of producing the apparatus, and a radiation imaging system using the apparatus and, more particularly, to an information reading apparatus having a wavelength conversion member such as a scintillator or the like, a production method of the apparatus, and a radiation imaging system using the apparatus.

2. Related Background Art

Under the trend toward filmless roentgenography, some companies have released semiconductor instruments provided with an X-ray area sensor in recent years, and methods thereof are generally classified under two types, a direct system (a type in which X-rays are directly converted into electric signals to be read) and an indirect system (a type in which X-rays are once converted into visible light and the visible light is then converted into electric signals to be read).

FIG. 1A is a schematic, cross-sectional view of an information reading device provided with an example of the X-ray area sensor of the indirect system. FIG. 1B is a schematic plan view of FIG. 1A. In FIGS. 1A and 1B, numeral 401 designates a glass substrate, 402 MIS photosensor portions using amorphous silicon, 403 TFT switch portions, 404 electrode portions (areas where electrodes are provided), 411 a first protective layer made of a nitride or the like for electrically protecting the photosensor portions 402, the TFT switch portions 403, etc., 412 a scintillator made of, for example, cesium iodide (CsI) as a wavelength conversion member, 413 a scintillator protecting layer made of an organic resin for protecting the scintillator 412 from external water or the like, 414 a reflective substrate with a high reflectance made of an aluminum sheet or the like, and 415 a second protective layer made of an organic substance such as polyimide (PI) or the like for protecting the photosensor portions 402 etc. from impurities in the scintillator 412.

When X-rays are incident from the upper part of FIG. 1A, the X-rays permeate the reflective substrate 414 and the scintillator protecting layer 413 to be absorbed by the scintillator 412. The scintillator 412 absorbing the X-rays emits visible light in all the directions in the bulk. At this time, since the crystals of the scintillator 412 are of the vertically grown columnar shape as illustrated in FIG. 1A, the light emitted in the bulk eventually travels in the longitudinal direction of the columnar shape with being reflected at grain boundaries, substantially according to the principle of light transmittance in optical fibers.

Then, most of the light is concentratedly guided to the photosensor portions 402 and TFT switch portions 403 in the lower part of FIG. 1A. Therefore, this structure is able to achieve a high sensitivity and improvement in resolution.

A production method of the information reading device as an X-ray area sensor illustrated in FIGS. 1A and 1B will be described below. The X-ray area sensor illustrated in FIGS. 1A and 1B is a semiconductor device obtained by forming the photosensor portions 402 and TFT switch portions 403 on the glass substrate 401, thereafter forming the first protective layer 411 thereon, and further forming the second protective layer 415 thereon. In this state the scintillator 412 is directly deposited onto the second protective layer 415 by vapor deposition while portions without necessity for the vapor deposition are preliminarily covered with a mask (not shown).

In order to make the scintillator 412 of the ideal columnar structure of cesium iodide, although the temperature during the vapor deposition is preferably not less than 200° C., but the temperatures of not less than 200° C. will deteriorate the photosensor portions 402 and the TFT switch portions 403 already formed, the scintillator 412 has to be formed at a temperature of not more than 200° C.

After the formation of the scintillator 412 through the vapor deposition, a protective film for moisture resistance is bonded thereonto to form the scintillator protecting layer 413. An aluminum sheet as the reflective substrate 414 is then bonded thereonto, thus completing the X-ray area sensor.

When the scintillator 412 is formed in this way by directly depositing cesium iodide onto the glass substrate 401 having the photosensor portions 402 and TFT switch portions 403 formed thereon, the optically advantageous structure can be provided, but on the other hand the temperature has to be kept not more than 200° C.

This means that, where the photosensor portions 402 and TFT switch portions 403 are formed of amorphous silicon, optimization has to be implemented within the temperature range such that hydrogen atoms do not become unbound.

FIGS. 2A and 2B are a schematic plan view and a schematic, cross-sectional view of a large information reading device, for example, provided with four area sensors, which are the semiconductor devices illustrated in FIGS. 1A and 1B. In the information reading device illustrated, the four area sensors are bonded onto the substrate 605 (arranged adjacent to one another) and the scintillator 412 is directly deposited onto them. The four area sensors are fixed on the substrate 605 through an adhesion layer 606.

For this structure, a gap 650 is created between adjacent area sensors as illustrated in FIG. 2A and the plane of the vapor deposited surfaces of the scintillator is divided near the gap; therefore, the scintillator 412 also grows in the lateral direction in the figure. The crystals of the scintillator near the gap 650 are not formed in the shape of columns perpendicular to the second protective layer 415 when compared with those in the other portions, accordingly.

FIGS. 3A and 3B show another information reading device provided with an area sensor which has a glass substrate 401 having photosensor portions 402 and TFT switch portions 403 formed on a surface thereof, and a scintillator 412 of the optimum columnar structure provided on the surface.

In FIGS. 3A and 3B, numeral 511 designates a protective layer made of, for example, a nitride or the like for protecting the photosensor portions 402, etc. from external water, 512 an adhesion layer for bonding the scintillator 412 and the protective layer 511 to each other, and 515 a seal portion made of an organic resin. Members similar to those illustrated in FIGS. 1A and 1B are denoted by the same reference numerals.

In the information reading device illustrated in FIGS. 3A and 3B, the scintillator 412 is vapor deposited on the reflective substrate 414. The photosensor portions 402, etc. and the protective layer 511 are formed on the glass substrate 401 to obtain a semiconductor device, and the scintillator 412 is bonded onto the protective layer 511 through the adhesion layer 512. In the last step, the scintillator 412 and the adhesion layer 512 are sealed by a sealant 515.

When the part of the reflective substrate 414 and the part of the glass substrate 401 are bonded to each other in this way, it becomes feasible to form the scintillator 412 on the reflective substrate 414 without care on deterioration of the photosensor portions 402, etc. due to the temperature during the vapor deposition of the scintillator 412, and thus to obtain the ideal columnar structure. However, since cesium iodide as the material of the scintillator 412 is brittle, it is necessary in this structure to pay close attention so as not to break the scintillator 412 when bonding the scintillator 412 and the protective layer 511 to each other.

As described above, the information reading device illustrated in FIGS. 3A and 3B was fabricated by bonding the scintillator and the protective layer to each other, and the scintillator was sometimes broken in part in the bonding. The reason is that cesium iodide for forming the scintillator is brittle as described above.

Further, there were desires for further improvement in the sensitivity of the information reading device illustrated in FIGS. 3A and 3B. It is necessary herein to decrease the thickness of the reflective substrate in order to improve the sensitivity. This is because the reflective substrate absorbs incident X-rays or the like and the reflective substrate, if it is thick, decreases the quantity of X-rays reaching the wavelength conversion member such as the scintillator or the like. However, with decrease in the thickness of the reflective substrate, the scintillator was sometimes split or broken during the bonding between the protective layer and the reflective substrate, or the scintillator itself was crumpled in certain cases.

In the case of the information reading devices illustrated in FIGS. 1A and 1B and in FIGS. 2A and 2B, since the scintillator was directly vapor deposited onto the second protective layer having the amorphous silicon elements formed thereon, there was the limitation of use temperature because of the weakness of amorphous silicon to high temperatures as described above, and there was the problem that the scintillator was not allowed to be formed at the temperature suitable for obtaining the ideal columnar structure for the scintillator.

Further, with the incidence of X-rays on the information reading device as illustrated in FIGS. 2A and 2B, the sensitivity to X-rays is uneven and thus unpreferable near the gap 650, because the shapes of the crystals of the scintillator are not columnar there. Therefore, there were desires for improvement therein.

SUMMARY OF THE INVENTION

An object of the present invention is to provide an information reading apparatus capable of preventing the scintillator from being broken during the bonding of the scintillator to the device-side surface, and a radiation imaging system having it.

Another object of the present invention is to provide an information reading apparatus improved in the sensitivity throughout the entire image-receiving area, and a radiation imaging system having it.

Still another object of the present invention is to provide an information reading apparatus capable of reading information with higher quality and without unevenness of sensitivity throughout the entire image-receiving area, and a radiation imaging system having it.

Another object of the present invention is to provide a production method involving no breakage of the wavelength conversion member such as the scintillator or the like.

According to a first aspect of the present invention, there is provided an information reading apparatus comprising a first substrate having a wavelength conversion member formed thereon and a second substrate having a photoelectric conversion portion formed thereon, the first and the second substrates being bonded to each other through an adhesive, wherein a protective layer is formed so as to cover the wavelength conversion member on the first substrate.

According to a second aspect of the present invention, there is provided an information reading apparatus comprising a wavelength conversion means having a wavelength conversion member provided on a substrate, a sensor substrate having a plurality of photoelectric conversion elements arranged on a substrate, and a buffer layer provided between the wavelength conversion member and the photoelectric conversion elements.

According to a third aspect of the present invention, there is provided an information reading apparatus comprising a wavelength conversion means having a wavelength conversion member and a buffer layer provided in the mentioned order on a substrate and a sensor substrate having a plurality of photoelectric conversion elements provided on a substrate, the wavelength conversion means and the sensor substrate being bonded to each other such that a protective layer is located on the side of the wavelength conversion member.

According to a fourth aspect of the present invention, there is provided a radiation imaging system comprising the information reading apparatus described above, a signal processing means for processing a signal from the information reading apparatus, a display means for displaying a signal from the signal processing means, and a radiation source for irradiating the information reading apparatus with radiation.

According to a fifth aspect of the present invention, there is provided a method of producing an information reading apparatus comprising preparing a substrate having a wavelength conversion member and a resin layer in an outermost surface, applying an adhesive to a sensor substrate provided with a photoelectric conversion element, and then bonding the substrate and the sensor substrate to each other such that the wavelength conversion member is located on the adhesive side.

BRIEF DESCRIPTION OF THE DRAWINGS

FIG. 1A is a schematic, cross-sectional view showing an example of the information reading apparatus and FIG. 1B is a schematic plan view thereof;

FIG. 3A is a schematic, cross-sectional view showing still another example of the information reading apparatus and FIG. 3B is a schematic plan view thereof;

FIG. 4A is a schematic, cross-sectional view showing still another example of the information reading apparatus and FIG. 4B is a schematic plan view thereof;

FIGS. 5A, 5B, 5C, 5D and 5E are views illustrating an example of the production steps of the information reading apparatus;

FIGS. 6A and 6B are views illustrating an example of the production method of the information reading apparatus;

FIG. 7A is a schematic, cross-sectional view showing another example of the information reading apparatus and FIG. 7B is a schematic plan view thereof;

FIGS. 10A and 10B are views illustrating an example of the production steps of arranging a plurality of sensor substrates;

FIGS. 11A and 11B are views illustrating an example of the production method of the information reading apparatus;

DETAILED DESCRIPTION OF THE PREFERRED EMBODIMENTS

FIG. 4A is a schematic, cross-sectional view illustrating a preferred example of the information reading apparatus of the present invention. FIG. 4B is a schematic plan view of the apparatus. In FIGS. 4A and 4B, numeral 101 designates a glass substrate, 102 MIS photosensor portions using amorphous silicon, 103 TFT switch portions, 104 an electrode portion, 111 a first protective layer comprised of a nitride or the like for electrically protecting the photosensor portions 102, etc., 112 a second protective layer comprised of an organic material such as PI or the like for preventing impurities in the scintillator 115 comprised of cesium iodide from penetrating the photosensor portions 102, etc., 113 an adhesion layer, 114 a scintillator protecting layer for protecting the scintillator from external water, 116 a reflecting layer comprised of aluminum or the like, 117 a base plate comprised of glass, and 121 a sealant comprised of an acrylic resin.

Figure 2A:
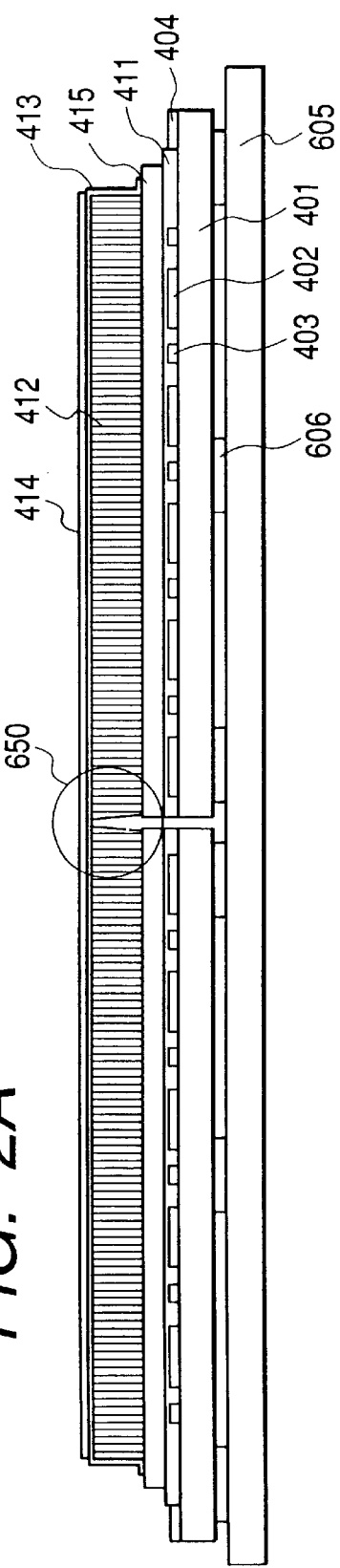
FIG. 2A is a schematic, cross-sectional view showing another example of the information reading apparatus
Figure 2B:
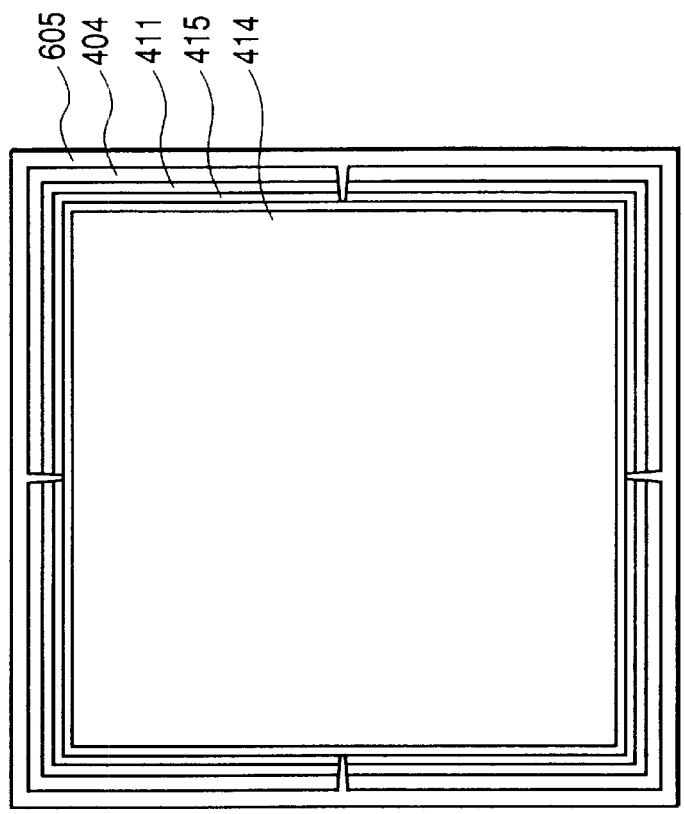
FIG. 2B is a schematic plan view thereof.
Figure 5C:
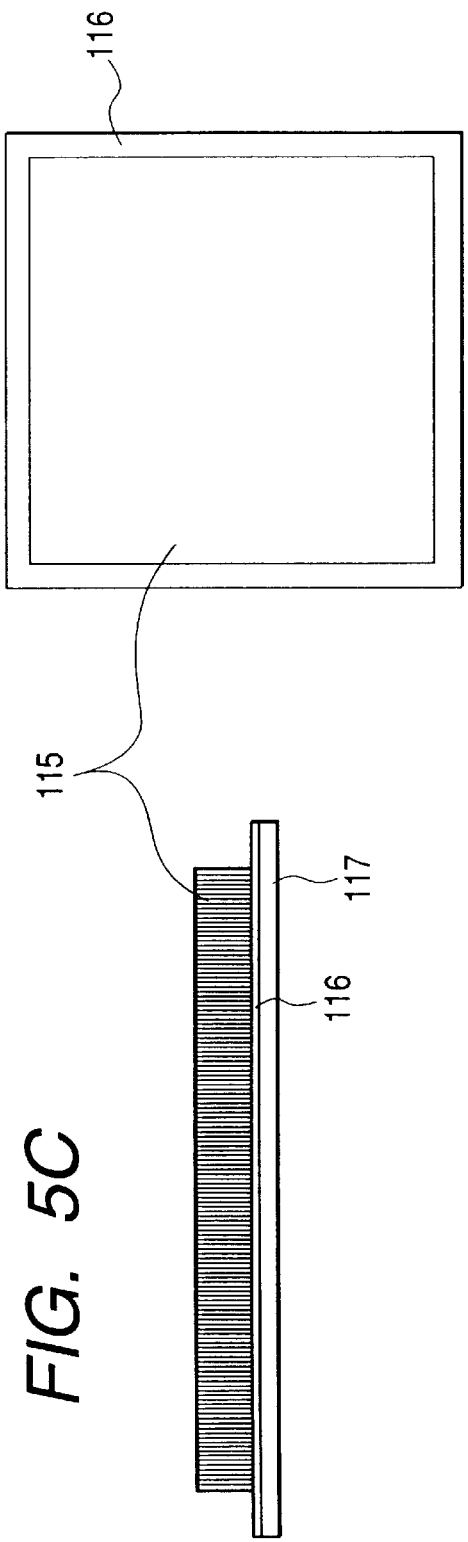

FIGS. 5A to 5E are schematic, cross-sectional views and schematic plan views showing an example of the production steps of the information reading apparatus illustrated in FIGS. 4A and 4B. The production steps of the information reading apparatus illustrated in FIGS. 4A and 4B will be described below with reference to FIGS. 5A to 5E. In the first step, aluminum is vapor deposited by sputtering or the like on the base plate 117 comprised of a thin glass sheet or the like to form the reflecting layer 116 (FIG. 5A).

Next, a mask 132 is placed on the edge portions of the reflecting layer 116. Then, the base plate 117 with the mask 132 placed deposited thereon is set in a vacuum chamber of a vapor deposition system (not shown), and thereafter cesium iodide is vapor deposited on only a necessary portion on the reflecting layer 116 while keeping the vapor deposition system at a temperature of not less than 200° C. (FIG. 5B). Then, the mask 132 and cesium iodide deposited thereon are removed to form the scintillator 115, which will become the image-receiving region (FIG. 5C).

These steps permit cesium iodide to grow in the optically ideal, columnar structure under minimized restriction of use temperature during the vapor deposition. The reflecting layer 116 functions to reflect light, e.g., light resulting from wavelength conversion in the scintillator 115 of the wavelength conversion member and also functions to improve the adhesion between the base plate 117 and the scintillator 115.

Figure 5D:
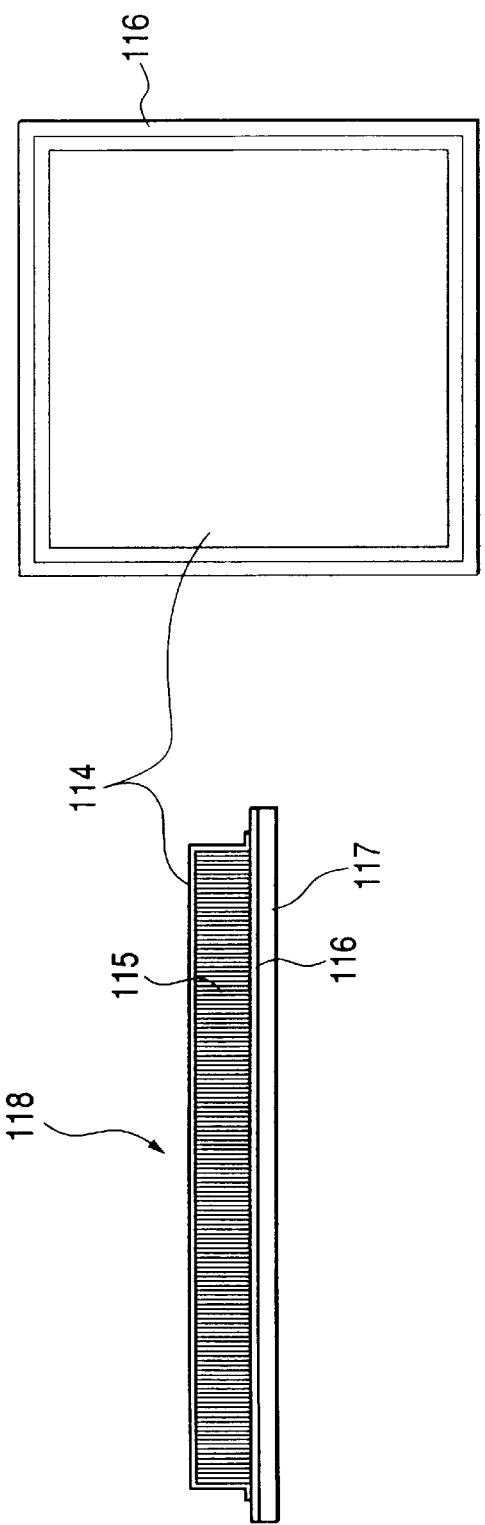

In the next step, in order to protect the scintillator 115 from outside water, the scintillator protecting layer 114 comprised of the organic resin is formed, thereby completing the base plate (wavelength conversion means 118) having the scintillator formed on a surface thereof (FIG. 5D). This provides the scintillator 115 with excellent moisture resistance and impact resistance.

On the other hand, the MIS photosensor portions 102 comprised of amorphous silicon, the TFT switch portions 103, and the electrode portion 104 are formed on the glass substrate 101 and the first protective layer 111 comprised of the nitride or the like is formed thereon. At this point, electrical inspection is conducted and only non-defective units are allowed to be supplied to the next step.

Figure 5E:
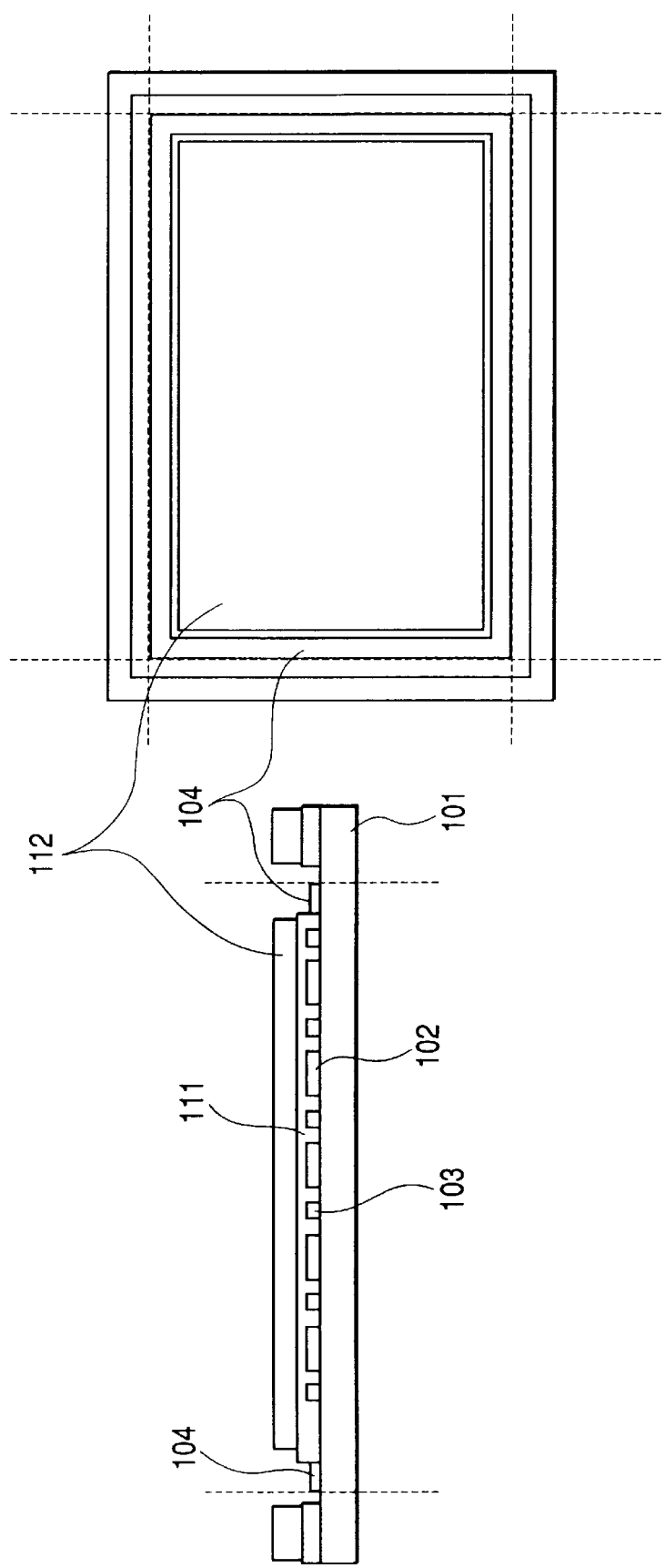

In the next step, the second protective layer 112 comprised of the organic material such as PI or the like is formed on the first protective layer 111 (FIG. 5E), and the substrate is cut into the designed size along the dashed lines illustrated in FIG. 5E, by a slicer or the like. After this, electrical connection parts may be mounted on the electrode portion 104. Thereafter, the adhesive layer 113 is applied on the second protective layer 112, and the second protective layer 112 and the scintillator protecting layer 114 of the wavelength conversion means 118 having the scintillator 115 illustrated in FIG. 5D are bonded to each other.

FIGS. 6A and 6B are views illustrating the step of bonding the second protective layer 112 and the wavelength conversion means 118 to each other. In the present embodiment, as illustrated in FIGS. 6A and 6B, the second protective layer 112 and the wavelength conversion means 118 are bonded to each other while proceeding with pressing successively from an edge to an opposite edge, for example, by a roller 131 or the like. At this time, the pressure of the roller 131 is controlled so as not to crush the scintillator 115.

Further, the scintillator protecting layer 114 comprised of the organic material and/or the second protective layer 112 act as an impact-resistant buffer material for preventing the scintillator 115 from being broken in the bonding step. In the last step, the sealant 121 for preventing water from penetrating the adhesion layer 113 is applied to the periphery with a dispenser (not shown) or the like to seal the side surface portions.

Completed through these steps is the information reading apparatus which is the X-ray area sensor as illustrated in FIGS. 4A and 4B. Since the reflecting layer 116 also functions as an electrical noise shield, connection to a ground can be made before sealing the adhesion layer 113 as the occasion demands.

The present embodiment was described as the example wherein the material of the base plate 117 was glass, and this glass can be, for example, low alkali glass. Since the low alkali glass has a resistance to temperatures as high as 500° C. or more, it is enough to withstand the temperatures of 100° C. to 200° C. encountered during the vapor deposition of the reflecting layer 116 comprised of aluminum and even the temperatures of 250° C. to 300° C. encountered during the vapor deposition of cesium iodide.

Further, when the thickness of the base plate 117 comprised of low alkali glass is about 0.05 mm, the transmittance of about 99.5% can be assured even in the case of incidence of X-rays of, for example, 60 keV.

When amorphous carbon is used as a material of the base plate 117, the amorphous carbon has a lower X-ray absorption coefficient, as compared with the low alkali glass (X-ray absorptance of glass is 1.0 cm$^{-1}$, whereas that of amorphous carbon 0.25 cm$^{-1}$); and thus demonstrates a high X-ray transmittance. Since the principal component of amorphous carbon is carbon, it is also excellent in heat resistance. Therefore, just as in the case of using the low alkali glass, amorphous carbon poses no problem in heat resistance during the vapor deposition and can assure the X-ray transmittance of about 99.7% even in the thickness of about 0.1 mm of the base plate 117.

Further, the amorphous carbon has the high electric conductivity of $2.4 \times 10^{-2}$ $\Omega^{-1}$ $cm^{-1}$, shows better chemical resistance than glass, and has the coefficient of thermal expansion nearly equivalent to that of glass (the coefficient of thermal expansion of glass is $4-5 \times 10^{-6}$, whereas that of amorphous carbon $2-3 \times 10^{-6}$). Thus use of amorphous carbon can eliminate the countermeasures against static electricity and the restriction of chemicals used in production.

Further, after the production, it can function as an electrical noise shield, protect cesium iodide from water and impurities in the surroundings, and prevent peeling of bonded portions due to difference in expansion or shrinkage from the sensor glass with a change in temperature. Particularly, even if a thin amorphous carbon sheet is bonded, there is no generation of crumples, as is the case with glass.

On the other hand, when a heat-resistant polyimide sheet is used for the base plate 117, it also functions as a buffer for preventing the scintillator from being broken in the bonding step, and thus can increase the productivity of the apparatuses. Incidentally, the polyimide is not different greatly from the low alkali glass, etc. in terms of the heat resistance and X-ray absorptance.

Further, the scintillator protecting layer 114 may be made of only the organic resin, but the layer needs to be thin enough to prevent optical blurring. If the thickness is too small to prevent penetration of water because of high permeability of water, the penetration of water can be prevented by vapor depositing a metal layer or a metal compound layer between the scintillator 115 and the polymer material.

FIG. 7A is a schematic, cross-sectional view of the information reading apparatus applied to an X-ray area sensor in accordance with another preferred embodiment of the present invention. FIG. 7B is a schematic plan view thereof. This apparatus is different from the aforementioned apparatus illustrated in FIGS. 4A and 4B in that there is no layer corresponding to the second protective layer 112. This results from the difference between the production methods of the information reading apparatuses as described hereinafter. In FIGS. 7A and 7B, members similar to those in FIGS. 4A and 4B are denoted by the same reference numerals.

Figure 8:
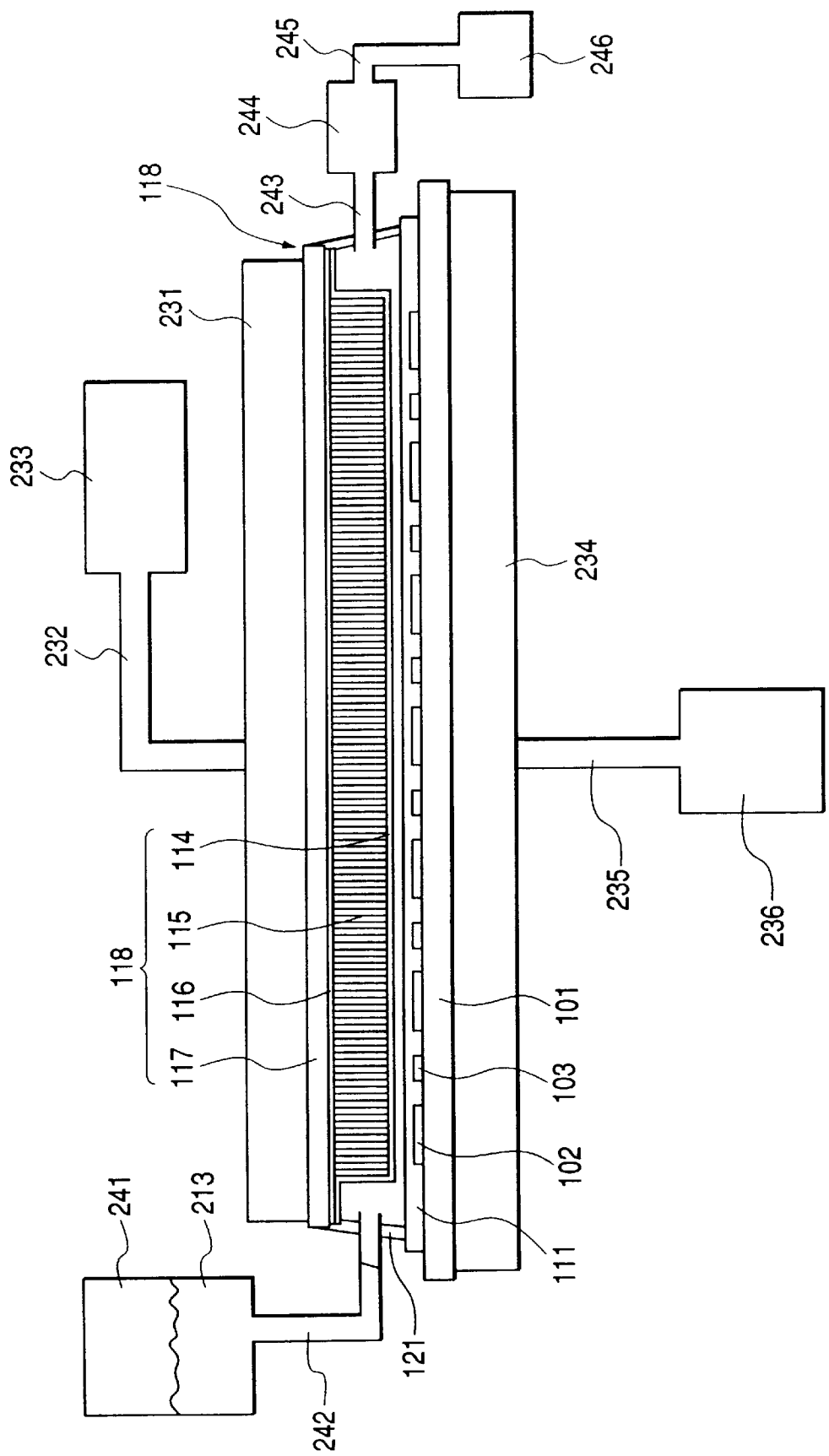
FIG. 8 is a view illustrating an example of the production method of the information reading apparatus.

FIG. 8 is a schematic, cross-sectional view illustrating a bonding system for bonding the wavelength conversion means 118 having the base plate 117 with the scintillator 115, etc. formed thereon, on the glass substrate 101 with the photosensors 102, etc. formed thereon in the present embodiment.

In FIG. 8, numeral 231 is a first stage for holding the base plate 117. The first stage 231 is bored and can be adsorptively attached to the base plate 117 by driving a vacuum pump 233 connected through a tube 232. Numeral 234 denotes a second stage for holding the glass substrate 101. The second stage 234 is connected to a vacuum pump 236 through a tube 235 and the second stage 234 adsorptively holds the glass substrate 101 similarly. Numeral 241 represents a tank for an adhesive, 242 a guide tube for guiding the adhesive, 243 a vacuum tube, 244 an adhesive buffer tank for storing an excess of the adhesive, 245 a vacuum tube, and 246 a vacuum pump.

In the bonding step, first, the base plate 117 and the glass substrate 101 are vacuum-chucked to the first stage 231 and to the second stage 234, respectively, and then the glass substrate 101 and the base plate 117 are bonded to each other by the sealant 121. In practice, the sealant 121 is applied between the first protective layer 111 on the glass substrate 101 and the protective layer 114 on the base plate 117 to seal them.

At this time, at least two or more holes are bored as an adhesive filling port and a vacuum port in the sealant 121. Then, the guide tube 242 of the adhesive 213 is connected to one hole and the vacuum tube 243 to the other hole as illustrated in FIG. 8. Under a vacuum through the vacuum tube 243, the adhesive 213 flows from the adhesive tank 241 through the guide tube 242 into a gap between the first protective layer 111 and the scintillator protecting layer 114.

During this operation, the base plate 117 and the glass substrate 101 are kept as chucked to the first stage 231 and to the second stage 234, respectively. In the final step, the adhesive filling port and the vacuum port are sealed, thereby completing the X-ray area sensor illustrated in FIGS. 7A and 7B.

In this example, since the base plate 117 and the glass substrate 101 are bonded to each other by the bonding system as illustrated in FIG. 8, the pressure applied to the scintillator 115 is smaller than that in the case of using the roller 131 described previously. For that reason, adequately sure and stable bonding can be implemented without provision of the second protective layer 112 having the function of preventing the scintillator 115 from being broken. The elimination of the second protective layer 112 can increase the transmittance.

Figure 9A:
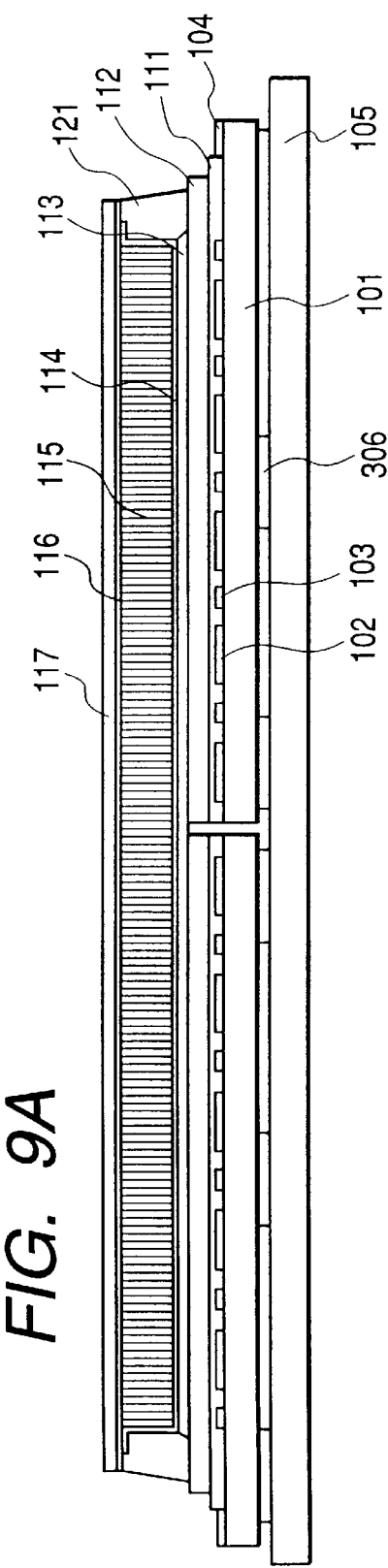
FIG. 9A is a schematic, cross-sectional view showing another example of the information reading apparatus
Figure 9B:
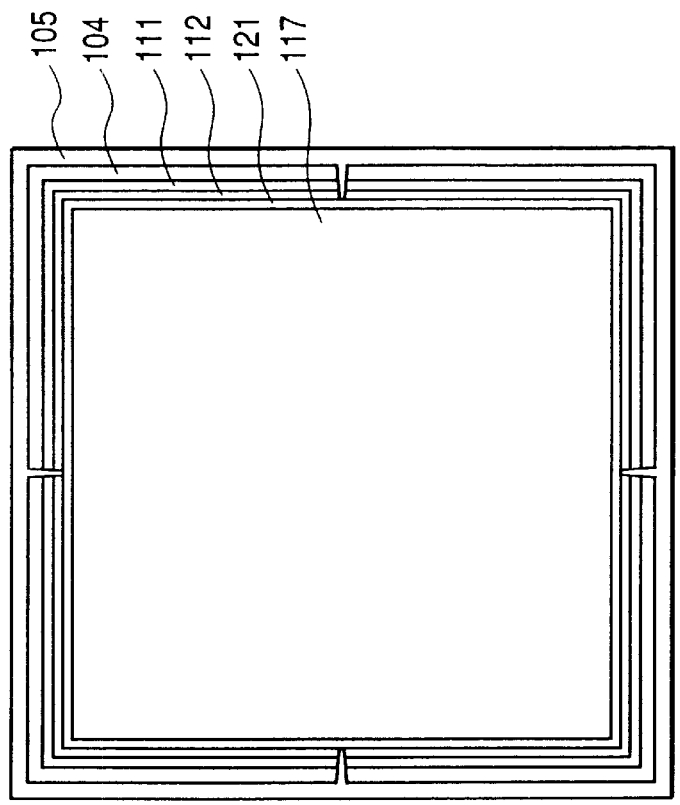
FIG. 9B is a schematic plan view thereof.

FIG. 9A is a schematic, cross-sectional view of the information reading apparatus applied to an X-ray area sensor in accordance with still another preferred embodiment of the present invention. FIG. 9B is a schematic plan view thereof. In FIGS. 9A and 9B, numeral 105 indicates a substrate made of glass or the like, and 306 an adhesion layer for bonding the substrate 105 and the glass substrates 101 to each other. The members similar to those in FIGS. 4A and 4B are denoted by the same reference numerals.

FIGS. 10A and 10B are schematic, cross-sectional views and schematic plan views showing an example of the production steps of the glass substrates 101 side (i.e., the photosensor side) illustrated in FIGS. 9A and 9B. In the present example the production steps of the base plate 117 side (i.e., the wavelength conversion means side) may be similar to those described with reference to FIGS. 5A to 5C.

The second protective layer 112 comprised of an organic material such as PI or the like is formed on the first protective layer 111 (FIG. 10A) and the substrate is then cut into a desired size along the dashed lines illustrated in FIG. 10A, by a slicer or the like.

Next prepared are four sensor substrates, each including the photosensors, the glass substrates 101, etc. illustrated in FIG. 10A, and they are bonded through the adhesion layer 306 to the substrate 105 under the alignment of the four substrates in the vertical and the horizontal directions (FIG. 10B). At this time, an electrical connection portion may be mounted on the electrode portion 104. After this, the adhesive 113 is applied on the second protective layers 112, and then the second protective layers 112 and the scintillator protecting layer 114 of the wavelength conversion means 118 comprising the scintillator 115 are bonded to each other.

FIGS. 11A and 11B are views showing an example of the step of bonding the second protective layers 112 and the wavelength conversion means 118 comprising the scintillator 115 to each other. In the present example, as illustrated in FIGS. 11A and 11B, the second protective layers 112 and the wavelength conversion means 118 are bonded while urging them to each other (while pressing them successively from the edge portion to the central portion or while pressing them successively from the central portion to the edge portion) by, for example, the roller 131 as in the case illustrated in FIGS. 6A and 6B. At this time the pressure of the roller 131 is controlled so as not to crush the scintillator 115.

Further, the scintillator protecting layer 114 comprised of the organic resin and/or the second protective layers 112 act as an impact-resistant buffer material for preventing the scintillator 115 from being broken, as described previously. In the final step, the resin for preventing water from penetrating the adhesion layer 113 is then applied with a dispenser (not shown) or the like to all the end surfaces at the periphery of the wavelength conversion means 118.

The X-ray area sensor as illustrated in FIGS. 9A and 9B is completed through these steps. Since the reflecting layer 116 also functions as an electric noise shield, connection to a ground may also be made before sealing the adhesion layer 113 in this case as the occasion may demand.

As described above, even in cases where a plurality of (for example, four in this example) sensor substrates are tiled in the in-plane direction as in the present example, continuity is also maintained in the scintillator structure at the end surfaces of the respective sensor substrates and thus the apparatus is excellent in the optical sense and in terms of moisture resistance.

Subsequently, an X-ray imaging system provided with the information reading apparatus described above will be described hereinafter.

Figure 12A:
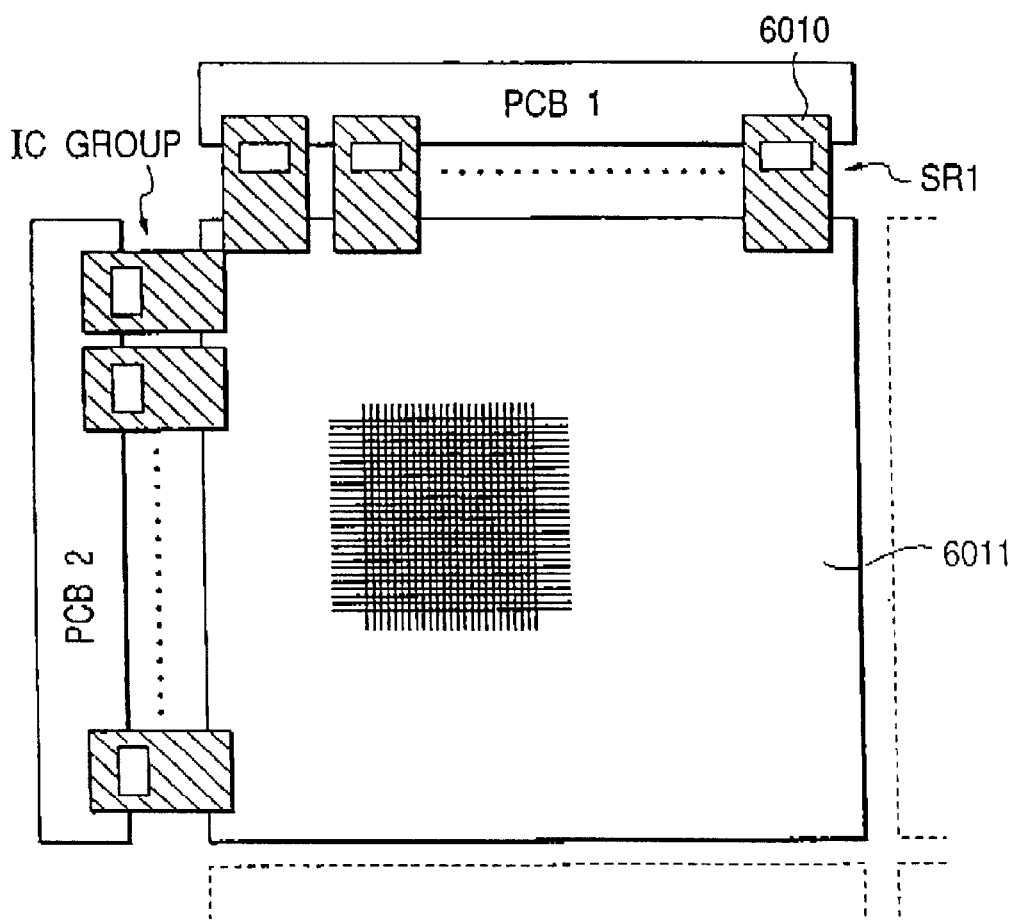
FIGS. 12A and 12B are views illustrating the schematic structure of the information reading apparatus.
Figure 12B:
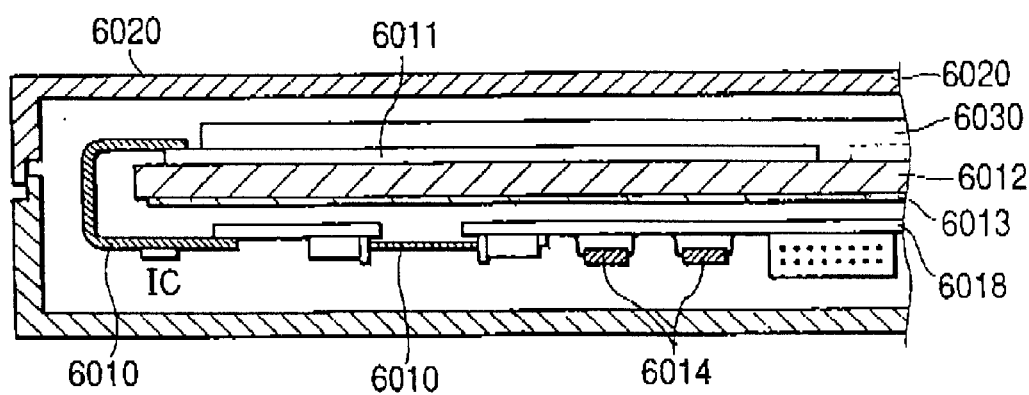

FIGS. 12A and 12B are a schematic, structural view and a schematic, cross-sectional view of the X-ray imaging system where the above information reading apparatus is applied as an image-receiving section thereof. A plurality of photoelectric conversion elements and transistors are formed in each sensor substrate 6011 as described previously. Flexible circuit boards 6010 equipped with drivers SR1 and integrated circuits for detection IC are connected to each sensor substrate.

The other sides of the flexible circuit boards 6010 are connected to either printed-circuit board PCB1 or PCB2. A plurality of such a-Si sensor substrates 6011 are bonded on the substrate 6012. A lead sheet 6013 for protecting memories 6014 in processing unit 6018 from X-rays is mounted on the bottom of the substrate 6012 forming the large information reading apparatus.

The wavelength conversion means 6030 (comprising, e.g., CsI) for converting, e.g., X-rays to visible light is bonded onto the sensor substrates 6011. In the present example the whole apparatus is housed in a case 6020 of carbon fiber, as illustrated in FIG. 12B, and the apparatus is used as an image-receiving section.

Figure 13:
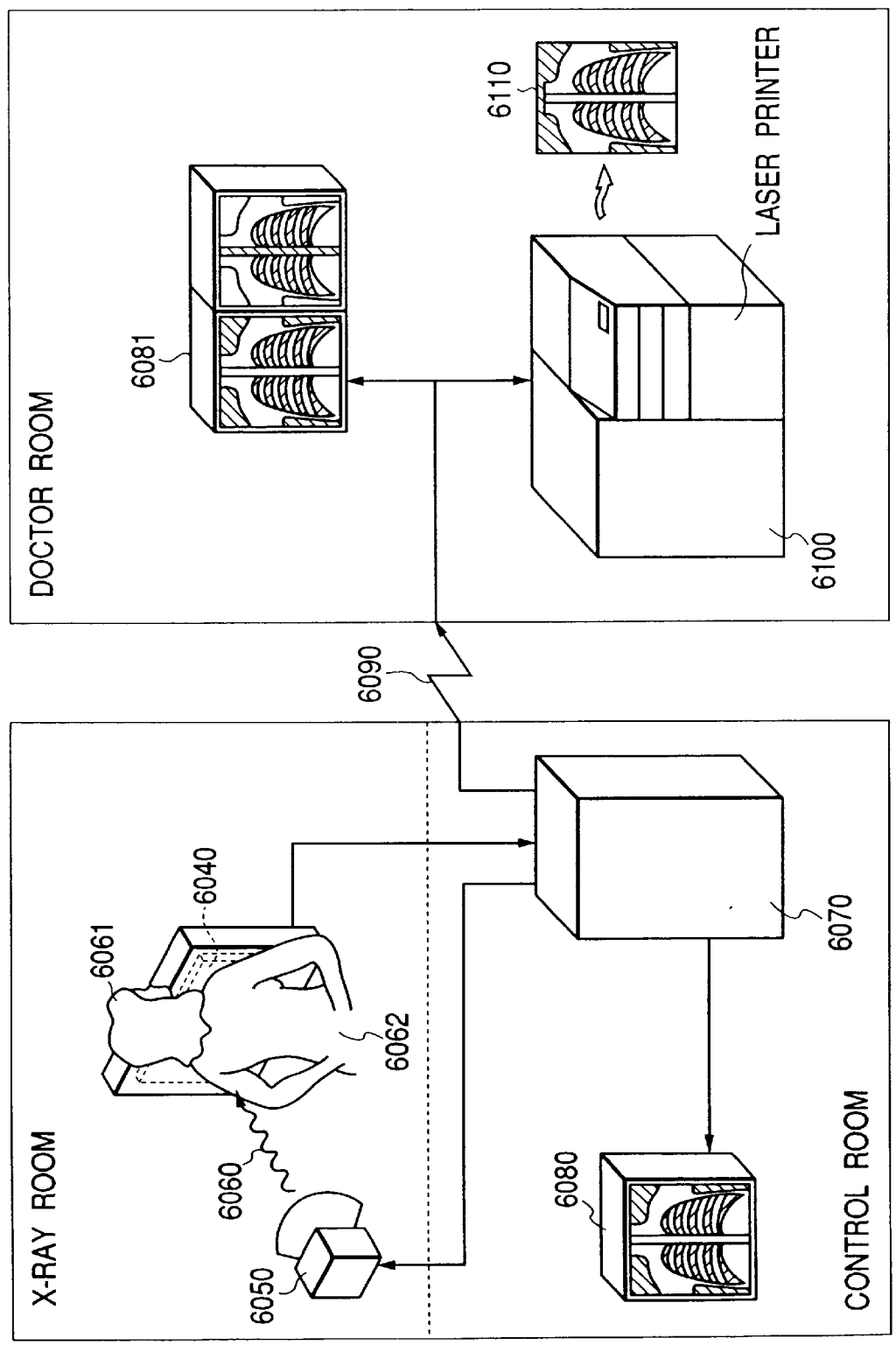
FIG. 13 is a view illustrating an example of the radiation imaging system.

FIG. 13 is a view showing an example of an X-ray diagnosis system provided with the above information reading apparatus. X-rays 6060 generated in an X-ray tube 6050 pass through a diagnosed part 6062 such as the chest part of a patient or subject 6061 and is then incident on the information reading apparatus 6040. The incident X-rays contain internal information of the subject 6061. In correspondence to the incidence of X-rays the scintillator emits light, which is photoelectrically converted to provide an electrical information. This information is converted to digital signals, which are picture-processed in a picture processor 6070 to be observed on a display 6080 in a control room.

Further, this information can also be transferred to a distant place through a transmission means such as a telephone network 6090 or the like and can be displayed on a display 6081 in a doctor room or the like where a diagnostician is present or stored in a storage means 6100 such as an optical disk or the like at another place. This allows a diagnostician such as a doctor or the like to make diagnosis at the distant place. The storage means may be recording on a film 6110 by output means such as a film processor or the like.

The present invention was described above with the example of the X-ray imaging system such as the X-ray diagnosis system or the like, but the present invention can also be applied to imaging systems for imaging radiations such as α-, β-, γ-rays or the like except for the X-rays. In this case, the scintillator can be one capable of converting the radiations to electromagnetic waves containing those within the wavelength range that can be detected by photoelectric conversion elements (for example, to the visible light).

As described above, according to the present invention, by forming the protective layer to cover the scintillator formed on the first substrate, it is possible to prevent the scintillator from being broken.

What is claimed is:

1. An information reading apparatus comprising a wavelength conversion means having a wavelength conversion member provided on a first substrate, a sensor substrate having a plurality of photoelectric conversion elements arranged on a second substrate, the wavelength conversion means and the sensor substrate being bonded to each other, and a buffer layer provided between the wavelength conversion member and the photoelectric conversion elements, wherein the buffer layer comprises a first protective layer comprised of an organic material for protecting the wavelength conversion member and a second protective layer comprised of an organic material for protecting the plurality of photoelectric conversion elements, and wherein the buffer layer acts as an impact-resistant layer during bonding of the wavelength conversion means and the sensor substrate.

2. The information reading apparatus according to claim 1, wherein the buffer layer comprises a resin.

3. The information reading apparatus according to claim 1, wherein the wavelength conversion means has the buffer layer.

4. The information reading apparatus according to claim 3, wherein the buffer layer comprises a resin.

5. The information reading apparatus according to claim 1, wherein the sensor substrate has the buffer layer.

6. The information reading apparatus according to claim 5, wherein the buffer layer comprises a resin.

7. The information reading apparatus according to claim 1, wherein each of the wavelength conversion means and the sensor substrate has the buffer layer.

8. The information reading apparatus according to claim 7, wherein the buffer layer comprises a resin.

9. A radiation imaging system comprising the information reading apparatus as set forth in claim 1, a signal processing means for processing a signal from the information reading apparatus, a display means for displaying a signal from the signal processing means, and a radiation source for irradiating the information reading apparatus with radiation.

10. The radiation imaging system according to claim 9, further comprising a recording means for recording a signal from the signal processing means.

11. The radiation imaging system according to claim 9, further comprising a transmitting means for transmitting a signal from the signal processing means.

12. The radiation imaging system according to claim 9, further comprising a recording means for recording a signal from the signal processing means and a transmitting means for transmitting a signal from the signal processing means.

13. The information reading apparatus according to claim 1, wherein the impact-resistant layer protects against breakage of the wavelength conversion member.

14. A method of producing an information reading apparatus which includes a wavelength conversion means having a wavelength conversion member provided on a first substrate, a sensor substrate having a plurality of photoelectric conversion elements arranged on a second substrate, and a buffer layer provided between the wavelength conversion member and the photoelectric conversion elements, wherein the buffer layer comprises a first protective layer comprised of an organic material for protecting the wavelength conversion member and a second protective layer comprised of an organic material for protecting the plurality of photoelectric conversion elements, comprising the steps of:

forming a resin layer as the first protective layer of the buffer layer on the wavelength conversion means;

applying an adhesive to the sensor substrate; and bonding the wavelength conversion means and the sensor substrate to each other such that the wavelength conversion means is located on the adhesive side of the sensor substrate, wherein the buffer layer acts as an impact-resistant layer during the bonding step.

15. The method according to claim 14, comprising a step of placing the wavelength conversion means on the adhesive and then carrying out pressing in a direction from the wavelength conversion means to the sensor substrate with a roller.

16. The method according to claim 15, wherein the pressing is carried out while moving the roller on the wavelength conversion means.

* * * * *